(12) United States Patent
Shibata et al.

(10) Patent No.: US 8,536,939 B2
(45) Date of Patent: Sep. 17, 2013

(54) CROSS-COUPLED MULTIPATH FEEDFORWARD OPERATIONAL AMPLIFIERS

(75) Inventors: Hajime Shibata, Toronto (CA); Richard Schreier, Toronto (CA); Wenhua Yang, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 15 days.

(21) Appl. No.: 13/292,835

(22) Filed: Nov. 9, 2011

(65) Prior Publication Data
US 2013/0113569 A1    May 9, 2013

(51) Int. Cl.
*H03F 3/68* (2006.01)
(52) U.S. Cl.
USPC ........................................ 330/124 R; 330/310
(58) Field of Classification Search
USPC ................... 330/53, 84, 98, 133, 150, 124 R, 330/253, 254, 295, 310
See application file for complete search history.

(56) References Cited

U.S. PATENT DOCUMENTS

| | | | |
|---|---|---|---|
| 6,002,299 A | 12/1999 | Thomsen | |
| 6,184,748 B1 | 2/2001 | Rao et al. | |
| 7,173,485 B2 * | 2/2007 | Nagai | 330/107 |
| 7,301,395 B2 | 11/2007 | Mobbs | |
| 7,365,668 B2 | 4/2008 | Mitteregger | |
| 8,102,206 B2 * | 1/2012 | Shibata | 330/124 R |
| 2010/0283545 A1 | 11/2010 | Shibata | |
| 2011/0304393 A1 * | 12/2011 | Luff | 330/253 |

OTHER PUBLICATIONS

You, F. et al., "Multistage Amplifier Topologies with Nested Gm-C Compensation," IEEE Journal of Solid-State Circuits, vol. 32, No. 12, pp. 2000-2011, Dec. 1997.
Thomsen, A. et al., "A Five Stage Chopper Stabilized Instrumentation Amplifier using Feedforward Compensation," 1998 IEEE Symposium on VLSI Circuits, Digest of Technical Papers, pp. 220-223, Jun. 1998.

(Continued)

*Primary Examiner* — Khanh V Nguyen
(74) *Attorney, Agent, or Firm* — Kenyon & Kenyon LLP (57) ABSTRACT

An operational amplifier can include a plurality of amplifiers connected to form a plurality of amplification paths extending from an input terminal to an output terminal of the operational amplifier. An amplifier in one of the amplification paths can include an intrinsic amplification-transistor capacitance connected between a first amplifier input and a first amplifier output, and a cross-coupling capacitor connected between the first amplifier input and a second amplifier output. A plurality of the amplification paths can include series-connected amplifiers connected in parallel with the cross-coupled amplifier. The cross-coupling capacitor can have a capacitance value selected as a function of the intrinsic capacitance and a gain experienced between the amplifier inputs and outputs. The operational amplifier can include an AC coupling capacitor connected in series with the cross-coupled amplifier. The operational amplifier can be arranged in feedback configuration.

32 Claims, 7 Drawing Sheets

(56) References Cited

OTHER PUBLICATIONS

Thandri, B.K. et al., "A Robust Feedforward Compensation Scheme for Multistage Operational Transconductance Amplifiers with no Miller Capacitors," IEEE Journal of Solid-State Circuits, vol. 38, No. 2, pp. 237-243, Feb. 2003.

Mitteregger, G. et al., "A 14b 20mW 640MHz CMOS CT ΔΣ ADC with 20-MHz Signal Bandwidth and 12b ENOB," 2006 IEEE International Solid-State Circuits Conference, Digest of Technical Papers, pp. 62-63, Feb. 2006.

Mitteregger, G. et al., "A 20-mW 640-MHz CMOS Continuous-Time ΔΣ ADC with 20-MHz Signal Bandwidth, 80-dB Dynamic Range and 12-bit ENOB," IEEE Journal of Solid-State Circuits, vol. 41, No. 12, pp. 2641-2649, Dec. 2006.

Lee, Thomas H., The Design of CMOS Radio-Frequency Integrated Circuits, 2nd Edition, Section 9.6, "High-Frequency Amplifier Design: Neutralization and Unilateralization," pp. 294-297, Cambridge University Press, 2006.

\* cited by examiner

CROSS-COUPLED MULTIPATH FEEDFORWARD OPERATIONAL AMPLIFIERS

CROSS-REFERENCE TO RELATED APPLICATIONS

This application is related to U.S. patent application Ser. No. 12/463,231, filed on May 8, 2009, which is herein incorporated by reference in its entirety.

BACKGROUND

Many different kinds of circuits utilize operational amplifiers to achieve desired functionality. For example, application circuits utilize operational amplifiers arranged in negative feedback configurations to realize a predetermined gain or other mathematical function over a selected frequency range. To prevent instability when used in a negative feedback configuration, operational amplifiers typically include some frequency compensation scheme, whereby the phase shift of the feedback signal is tailored to prevent constructive interference with the input that, otherwise, would induce unwanted oscillations.

One operational amplifier architecture and related compensation scheme that is used is a two-stage amplifier having a compensation capacitor connected between the output of the operational amplifier and the input of the second stage. This scheme is also generally known as Miller compensation. One problem with such an architecture, however, is that it may not provide enough loop gain at low frequencies for some applications, especially if implemented in reduced-scale semiconductor technologies, such as nanometer gate-length CMOS processes. Moreover, extending such an architecture to more than two stages, to increase the loop gain, typically results in a phase lag of 270° or more at the output, again presenting stability concerns.

Another operational amplifier architecture that can be used to provide higher loop gain is a multipath feedforward architecture. Such an architecture has a plurality of distinct amplification paths in parallel, typically ranging from low order amplification paths to higher order amplification paths. For example, one such architecture may include first, second, and third amplification paths arranged in parallel, the first-order path having a single amplifier, the second-order path having two amplifiers connected in series, and the third-order path having three amplifiers connected in series. Each amplification path typically contributes a different frequency response to the output, and some paths are designed to bypass or feedforward past other paths at selected frequencies. Feeding forward effectively removes the deleterious frequency impact of the bypassed stages at the selected frequencies, thereby enabling higher gain at these frequencies without as much concern over stability.

One advantage of multipath feedforward operational amplifiers is that they typically provide a higher loop gain in a selected frequency band without a corresponding high unity-gain frequency requirement that typically exists for a single-path architecture achieving the same gain in the selected frequency band. This characteristic often manifests as a steeper loop gain below the unity-gain frequency for multipath feedforward architectures in comparison to two- or multi-stage single-path architectures.

However, one problem with multipath feedforward operational amplifiers is that they may be inefficient from both chip-area and power-consumption perspectives. The large number of amplifiers required for many different independent amplification paths requires both a large chip area to implement and a large amount power to operate. Another problem with multipath feedforward architectures is that steeper loop gains below unity-gain frequency and corresponding phase shifts, which are typically associated with these architectures, may provide unintended or unavoidable frequency compensation effects due to the parallel nature of the feedforward amplification paths, which may again lead back to stability concerns, especially in view of the increased gains achieved by these amplifiers.

Thus, there exists a need for a multipath feedforward operational amplifier that is more efficient from size and power perspectives, but which can also achieve high loop gain and stability performance.

BRIEF DESCRIPTION OF THE DRAWINGS

So that features of the present invention can be understood, a number of drawings are described below. However, the appended drawings illustrate only particular embodiments of the invention and are therefore not to be considered limiting of its scope, for the invention may encompass other equally effective embodiments.

DETAILED DESCRIPTION

A multipath feedforward operational amplifier can include a plurality of amplifiers connected to form a plurality of amplification paths extending from an input terminal to an output terminal of the operational amplifier. The operational amplifier can be formed by adding successively higher-order amplification paths to a third-order structure formed according to one of two different architectures. The successively higher-order amplification paths can be formed by adding one of two different, yet symmetrically related circuit structures. The operational amplifiers formed according to these architectures can provide more efficient power delivery to both noise-critical and output-driving amplifiers of the amplification paths, as well as more efficient scaling of other amplifiers of the amplification paths. As a result, the operational amplifier may deliver a given frequency response and transconductance for a much smaller representative total capacitance value in comparison to other architectures.

The plurality of amplifiers can include at least one amplifier in one of the amplification paths having capacitive input-output cross-coupling. Cross-coupling capacitors can be connected between inputs and an outputs of the amplifier to mitigate the Miller effect acting on intrinsic capacitances of the amplifier, which may be exacerbated by the high-gain, highly parallel nature of the operational amplifier architecture. The cross-coupled amplifier can be an amplifier within the operational amplifier architecture having a plurality of portions of amplification paths, each including a plurality of series-connected amplifiers, connected in parallel to the cross-coupled amplifier. The cross-coupling capacitors can have capacitance values within a predetermined range of a value given by CGD (A+1)/(A−1), where CGD is an intrinsic gate-to-drain capacitance of an amplification transistor of the amplifier, and A is the gain experienced between the input and output of the amplifier in the architecture of the operational amplifier.

The operational amplifier can further include AC coupling capacitors connected in series with an amplifier in one of the plurality of amplification paths, such as the amplifier having the capacitive input-output cross-coupling. The AC coupling can provide gain and stability benefits similar to those provided by the cross-coupling.

Figure 1:
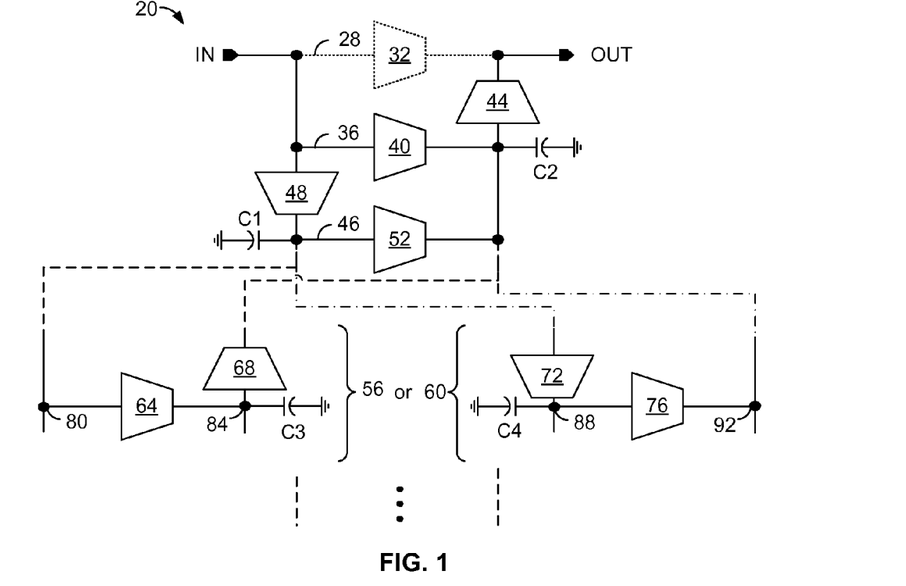
FIG. 1 is a circuit schematic depicting an embodiment of a multipath feedforward operational amplifier architecture.
Figure 2:
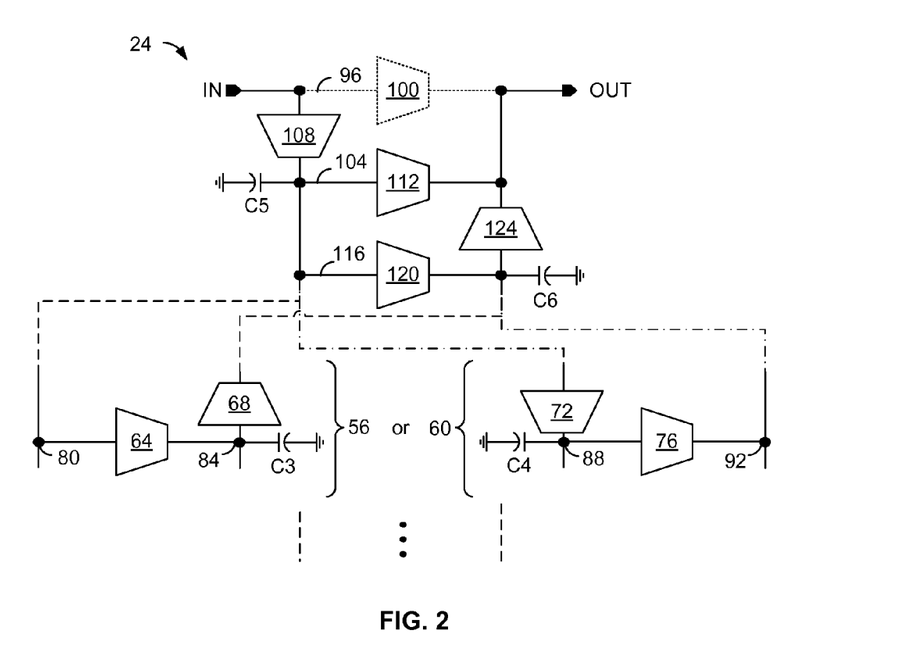
FIG. 2 is a circuit schematic depicting another embodiment of a multipath feedforward operational amplifier architecture.

FIGS. 1 and 2 depict embodiments of architectures for forming multipath feedforward operational amplifiers 20, 24 having improved chip area and power consumption properties. FIGS. 1 and 2 provide recipes for building different embodiments of the operational amplifiers 20, 24, which can have variable numbers of successively higher-order amplification paths stacked upon two different third-order structures shown in these figures, respectively. Each of the plurality of amplification paths of the operational amplifiers 20, 24 can each include one or more amplification stages, generally referred to herein as amplifiers, and can be partially distinct, partially overlapping and partially in parallel with each other.

The base third-order structure of FIG. 1 can include a first-order amplification path 28 having a single amplifier 32 connected between an input terminal IN and an output terminal OUT of the operational amplifier 20. A second-order amplification path 36 can include two amplifiers 40, 44 connected in series between the input and output terminals IN, OUT of the operational amplifier 20. A third-order amplification path 46 can include three amplifiers 48, 52, 44 connected between the input and output terminals IN, OUT. Note that the third amplifier 44 of the third-order amplification path 46 is the same as the second amplifier 44 of the second-order amplification path 36 in FIG. 1. The second and third order amplification paths 36, 46 can also include compensation or load capacitors C1, C2, which can represent either distinct, actual capacitors, or parasitic capacitances of devices of the various amplifiers.

Beyond this third-order structure, different embodiments of the operational amplifier 20 of FIG. 1 can be formed by including additional increasingly higher-order amplification paths by adding one or the other of two different, yet symmetrically related circuit structures or subcircuits 56, 60 across the second amplifier 52 of the third-order amplification path 46 and the structure so formed. The subcircuits 56, 60 can be added in the alternative in FIG. 1, with a first subcircuit 56 depicted on the left and a second subcircuit 60 depicted on the right, as additional "layers" to the stack of amplifiers making up the third-order structure already described. Any number of additional first or second subcircuits 56, 60 can be added to the operational amplifier 20 to form successively higher-order amplification paths and operational amplifiers 20. The first subcircuit 56 can includes two amplifiers 64, 68 connected in series and a capacitor C3, and the second subcircuit 60 can also include two amplifiers 72, 76 connected in series and a capacitor C4, albeit with a different arrangement than in the first subcircuit 56. The capacitances C3, C4 of the subcircuits 56, 60 can again be load or compensation capacitances, and be formed either as distinct, actual capacitors, or effectively implemented as parasitic capacitances.

In an illustrative embodiment of forming high-order operational amplifiers using the architecture of FIG. 1, a fourth-order amplification path could be formed by adding the first subcircuit 60 across the second amplifier 52 of the third-order amplification path 46. A fifth-order amplification path could then be formed by again adding a first or second subcircuit 56, 60 across connection nodes 80, 84 of the first subcircuit 56. This process can be repeated by adding additional either first or second subcircuits 56, 60 to connection nodes 80, 84, 88, 92 of the last subcircuit added to form successively higher-order amplification paths. In another example, a fourth-order amplification path could instead be formed by adding the second subcircuit 60 across the second amplifier 52 of the third order amplification path 46. A fifth-order amplification path could then formed by adding the first or second subcircuit 56, 60 across the connection nodes 88, 92 of the second subcircuit, and so on, to form successively higher-order amplification paths. Structural differences can be introduced into various embodiments of the operational amplifier 20 constructed according to the architecture of FIG. 1 (and FIG. 2) by selecting different successive combinations of added first and second subcircuits 56, 60 to form higher-order amplification paths. These structural differences can be used to tailor aspects of the benefits of the architectures of FIGS. 1 and 2 to specific situations.

The multipath feedforward operational amplifier 24 of FIG. 2 can also have a plurality of successively higher-order, partially distinct and partially parallel amplification paths constructed by adding either the first or second subcircuits 56, 60 to the depicted third-order structure. In FIG. 2, the third-order structure can include a first-order amplification path 96 have an amplifier 100 connected between input and output terminals IN, OUT. The second-order amplification path 104 can include two amplifiers 108, 112 connected in series between the input and output terminals IN, OUT, and the third-order amplification path 116 can include three amplifiers 108, 120, 124 connected in series between the input and output terminals IN, OUT. Note that the first amplifier 108 of the third-order amplification path 116 is the same as the first amplifier 108 of the second-order amplification path 104 in FIG. 2. The second- and third-order amplifications paths 104, 116 can also include capacitors C5, C6, which can again be load or compensation capacitances, and be formed either as distinct, actual capacitors, or effectively implemented as parasitic capacitances. As with the embodiment of FIG. 1, in FIG. 2 higher-order operational amplifiers 24 can be formed by adding higher-order amplification paths by successively adding either the first or second subcircuits 56, 60 across the second amplifier 120 of the third order path 116 or to the connection nodes 80, 84, 88, 92 of the subcircuits 56, 60 so added.

The first-order amplification paths 28, 96, including their amplifiers 32, 100, connected between the input and output terminals IN, OUT in FIGS. 1 and 2 can optionally be either included or omitted from operational amplifiers 20, 24, as is depicted using dashed-line representations of these first paths 28, 96 and amplifiers 32, 100.

The various amplifiers of the amplification paths in FIGS. 1 and 2 are depicted as being transconductance amplifiers, i.e., voltage-to-current amplifiers. However, any of the amplifiers in amplification paths of embodiments of the multipath feedforward operational amplifiers 24, 28 can instead be voltage-to-voltage amplifiers, current-to-current amplifiers, or current-to-voltage amplifiers. Also, the amplifiers and connecting signal paths depicted in FIGS. 1 and 2 can represent be either single-ended, differential, or partially-single-ended and partially-differential amplifiers and signal paths.

The plurality of amplification paths of the operational amplifiers 20, 24 of FIGS. 1 and 2 can each include a number of amplifiers equal to the degree of its order. Additionally, taking into consideration a load capacitor (not shown) connected at the output terminals OUT, each amplification path can also optionally include a number of capacitors equal to the degree of its order. The operational amplifiers 20, 24 of FIGS. 1 and 2 can therefore achieve loop gains in selected frequency bands below unity gain frequency having a steepness according to its order, including, e.g., loop gain slopes of ideally at least −18 dB/octave for a third order embodiment, at least −24 dB/octave for a fourth order embodiment, and at least −30 dB/octave for a fifth order embodiment, etc. In embodiments, the operational amplifiers 20, 24 may achieve loop gains in selected frequency bands, below unity gain frequency, having a steepness according to its order that is slightly reduced from the ideal steepness described above, potentially due to various circuit inefficiencies, yet still steeper than the ideal steepness for a lower order embodiment, e.g., loop gain slopes steeper than −12 dB/octave for a third order embodiment, steeper than −18 dB/octave for a fourth order embodiment, and steeper than −24 dB/octave for a fifth order embodiment, etc. In yet other embodiments, the operational amplifiers 20, 24 may achieve loop gains in selected frequency bands below unity gain frequency having a steepness according to its order that is slightly reduced from the ideal steepness described above, and expressed as, e.g., loop gain slopes steeper than −15 dB/octave for a third order embodiment, steeper than −21 dB/octave for a fourth order embodiment, and steeper than −27 dB/octave for a fifth order embodiment, etc.

The operational amplifiers 20, 24 of FIGS. 1 and 2 can provide several benefits in comparison to other multipath feedforward architectures. Because the noise performance of the operational amplifiers 20, 24 can be dominated by the noise performance of the highest-order amplification path, and to some extent by the other higher-order amplification paths, the sharing of the first amplifier of a plurality of the highest-order amplification paths of the operational amplifier can allow efficient power delivery to this noise-critical amplifier. Also, because most of the output current in selected operational frequencies can typically be supplied by the last amplifier in the highest-order amplification path, and to some extent by the last amplifiers in other higher-order amplification paths, the summing of several of the lower-order stages at the same connection point to the last amplifier of the highest-order stage allows for this last amplifier to be provided with sufficient output-current driving capability, while at the same time allowing for more efficient scaling of the preceding amplifiers of the highest-order amplification stage. The difference between the benefits provided by the architectures of FIGS. 1 and 2 can be considered as providing different relative degrees of these noise-related and output-current-driving-capability-related benefits.

As a result of these benefits, the operational amplifiers of FIGS. 1 and 2 may deliver the same or substantially the same frequency-response and transconductance performance for a much smaller representative total capacitance value as other amplifier architectures. This reduced total capacitance value can translate to reduced chip area and cost for the operational amplifiers 20, 24.

Figure 3:
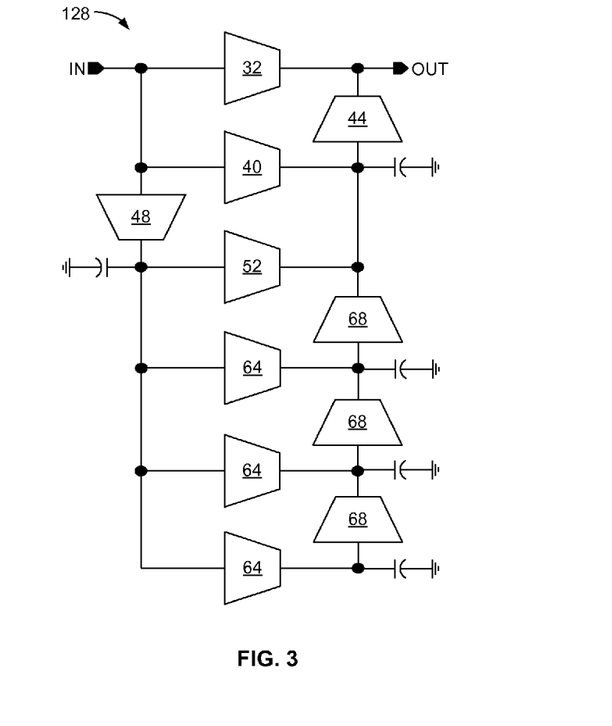
FIG. 3 is a circuit schematic depicting an embodiment of the multipath feedforward operational amplifier according to the architecture of FIG. 1.

FIG. 3 depicts an exemplary sixth-order embodiment 128 constructed using the multipath feedforward operational amplifier architecture 20 according to the architecture of FIG. 1.

The amplifiers of the plurality of amplification paths of the multipath feedforward operational amplifiers 20, 24 can be of varied configuration. Each amplifier can include at least one amplification transistor, or alternatively at least one pair of amplification transistors, to provide voltage or current signal amplification to generate an output signal from an input signal received by that amplifier.

FIGS. 4A-4F depict exemplary embodiments of amplification transistor configurations that can be used to implement the amplifiers of the plurality of amplification paths of the operational amplifiers 20, 24. Note that, although FIGS. 4A-4F primarily depict only the amplification transistor configurations of the amplifiers of the plurality of amplification paths, these amplification transistor configurations can typically be used in conjunction with further circuitry of the respective amplifier in which they are included, such as common-mode circuitry configured to control DC voltage levels at various amplifier circuit nodes, load transistor configurations connected to the output terminals OUT+, OUT−, current source transistor configurations connected to the output terminals OUT+, OUT−, and other circuit elements.

Figure 4A:
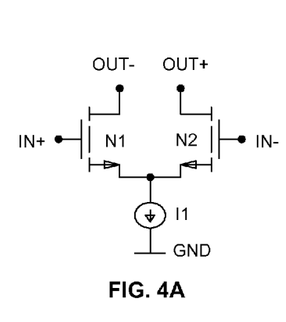
FIGS. 4A-4F are circuit schematics depicting embodiments of amplification transistor configurations of amplifiers of the multipath feedforward operational amplifier.
Figure 4B:
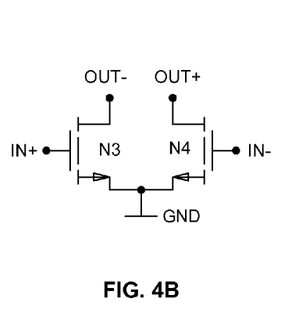
Figure 4C:
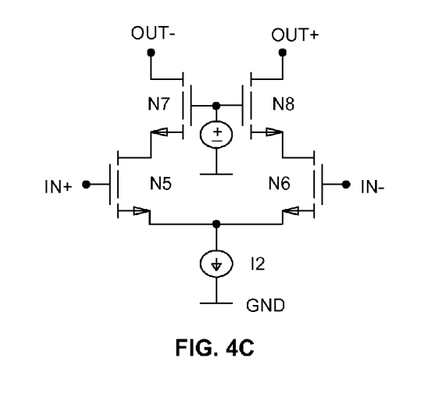
Figure 4D:
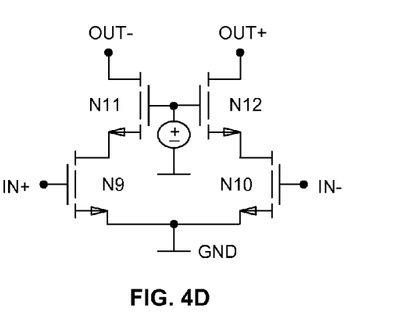

FIG. 4A depicts a differential pair of NMOS amplification transistors N1, N2, having gates connected to positive and negative input terminals IN+, IN−, drains connected to positive and negative output terminals OUT+, OUT−, and sources connected to a current source I1, which can be implemented using a current-source transistor configuration (not shown). FIG. 4B depicts a pseudo differential pair of NMOS amplification transistors N3, N4, having gates connected to positive and negative input terminals IN+, IN−, drains connected to positive and negative output terminals OUT+, OUT−, and sources connected to a reference voltage, e.g., ground. FIG. 4C-4D depict a cascode-configured versions of differential pairs similar to those depicted in FIGS. 4A-4B, in which NMOS common-gate amplification transistors N7, N8, N11, N12 can be connected between the output terminals OUT+, OUT− and the drains of NMOS differential pair amplification transistors N5, N6 (connected to a current source I2) or NMOS pseudo differential pair amplification transistors N9, N10. The common-gate amplification transistors N7, N8, N11, N12 can have gates connected to voltage references VREF1, VREF2.

Although FIGS. 4A-4D depict amplification transistor configurations having NMOS amplification transistors, corresponding PMOS versions of the amplification transistor configurations of FIGS. 4A-4D can be formed by substituting PMOS transistors for the depicted NMOS transistors, and providing complimentary interconnections appropriate for translating between NMOS and PMOS configurations.

Figure 4E:
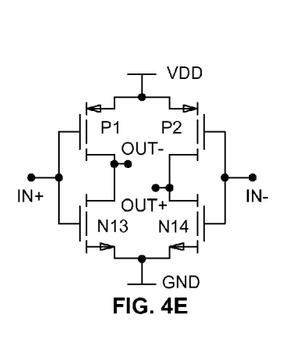
Figure 4F:
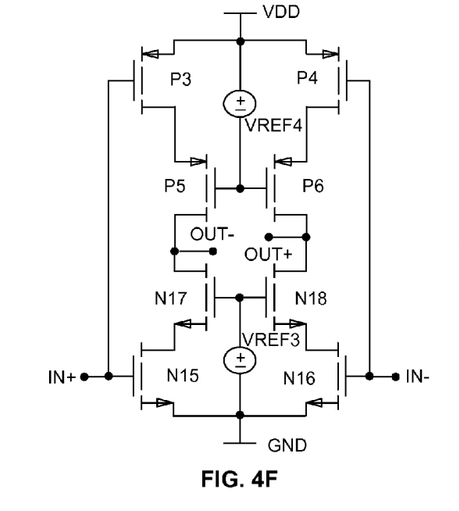

FIG. 4E depicts an embodiment of complementary pseudo differential pairs of NMOS and PMOS amplification transistors N13, N14, P1, P2, having gates connected to positive and negative input terminals IN+, IN−, drains connected to positive and negative output terminals OUT+, OUT−, and sources connected to fixed voltage sources, e.g., ground or a power supply. FIG. 4F depicts an embodiment of a cascode-configured version of complimentary pseudo differential pairs similar to those depicted in FIG. 4E, in which common-gate amplification transistors N17, N18, P5, P6 can be connected between the output terminals OUT+, OUT− and drains of complimentary pseudo differential pairs of NMOS and PMOS amplification transistors N15, N16, P3, P4. Optionally, the gates of the NMOS and PMOS amplification transistors directly connected together in FIGS. 4E-4F can instead be separated by voltage sources or AC coupling capacitors. The common-gate amplification transistors N17, N18, P5, P6 in FIG. 4F can have gates connected to voltage references VREF3, VREF4.

The operational amplifiers 20, 24 can be implemented as fully differential (i.e., having differential signal paths throughout), fully single-ended (i.e., having single-ended signal paths throughout), or partially-differential and partially-single-ended (i.e., having both differential and single-ended paths variously throughout). The amplification transistor configurations of FIGS. 4A-4F, or modifications thereof, can be used to implement any such differential or single-ended embodiments of the operational amplifiers 20, 24. The amplification transistor configurations of FIGS. 4A-4F can be modified to form corresponding single or single-ended amplification transistor configurations by including only the left or right circuit branch in any of the depicted embodiments. Alternatively, single-ended configurations can also be implemented by connecting one input terminal of the configurations in FIGS. 4A-4F to a fixed voltage, and the output taken from a single one of the output terminals, with or without the other output terminal having its signal referred to such an output terminal. Additionally, in partially-differential, partially-single-ended embodiments, depending on whether the input or the output is single-ended or differential, one input can be connected to a fixed voltage, and the output can be taken from both output terminals, or both inputs can be used and the output taken from a single one of the output terminals (with or without the other output terminal having its signal referred to the utilized output terminal).

Again, as already indicated above, the amplifiers of the plurality of amplification paths of the multipath feedforward operational amplifiers 20, 24 can include, in addition to at least one amplification transistor or amplification transistor pair, further circuitry such as common-mode circuitry configured to control DC voltage levels at various amplifier circuit nodes, load transistor configurations, current source transistor configurations, and other circuit elements. Also, the amplification transistor configurations of FIGS. 4A-4F can be used to implement amplifiers that voltage-to-voltage, current-to-current, voltage-to-current, or current-to-voltage amplifiers.

One difficulty that may be encountered with implementing embodiments of the operational amplifiers 20, 24 of FIGS. 1 and 2 is that having portions of a number of higher-order amplification paths effectively in parallel with some amplifiers of the relatively lower-order amplification paths may result in the exacerbation of an undesirable Miller effect problem in association with intrinsic or other feedthrough capacitances of such an amplifier and lower-order amplification path.

FIG. 5 depicts again the exemplary sixth-order embodiment of the operational amplifier 128 depicted in FIG. 3, showing an intrinsic capacitance C of one of the amplifiers 40 of the second-order amplification path 36. This intrinsic capacitance C can be a product of the specific implementation of this amplifier 40 of the second amplification path 36, and therefore be part of the amplifier 40 instead of separate and distinct from the amplifier 40, and is thus depicted in the figure with dashed lines to represent its intrinsic nature.

This amplifier 40 can be implemented using any of the amplification transistor configurations depicted in FIGS. 4A-4F. As discussed above, any of theses amplification transistor configurations can be used to implement voltage-to-voltage, voltage-to-current, current-to-current and current-to-voltage amplifiers. FIG. 6 depicts an exemplary implementation of this amplifier 40 using the amplification transistor configuration similar to that of FIG. 4A, augmented with the addition of current supplies 13, 14 connected to the drains of the amplification transistors N19, N20. The NMOS amplification transistors N19, N20 can each include an intrinsic gate-to-drain capacitance CGD connected between their gate and drain terminals. This capacitance may be a parasitic capacitance intrinsic to transistors, instead of a separate capacitance distinct from such transistors, and is thus represented in FIG. 6 using dashed lines. The intrinsic capacitance C in FIG. 5 may be a function of the intrinsic gate-to-drain capacitances CGD depicted in FIG. 6.

Returning to FIG. 5, the depicted embodiment of the operational amplifier has portions of the third, a fourth, a fifth and a sixth amplification path 46, 132, 136, 140 in parallel with this amplifier 40 of the second amplification path 36. Thus, between the input and output nodes of the second amplifier, an amplification can exist resulting not only from the amplification of this amplifier 40, but also from the amplification provided by the parallel portions of the third, fourth, fifth and sixth amplification paths 46, 132, 136, 140. This combined amplification can entail a relatively high gain, which can in turn exacerbate the Miller effect experienced by the intrinsic capacitance of the second amplifier 40.

Figure 7A:
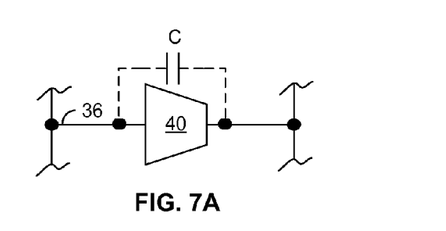
FIG. 7A is a circuit schematic depicting an embodiment of a portion of the amplification path including the amplifier having the intrinsic capacitance depicted in FIG. 5.
Figure 7B:
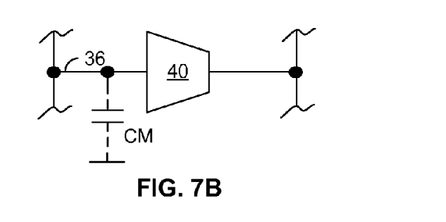
FIG. 7B is a circuit schematic depicting an embodiment of a portion of the amplification path including the amplifier having the intrinsic capacitance depicted in FIG. 5, and showing an equivalent capacitance produced by the Miller effect acting on the intrinsic capacitance.

The Miller effect, related to the Miller compensation scheme discussed above, can effectively magnify the capacitance felt at the input node of this amplifier 40 as a result of the intrinsic capacitance C. FIGS. 7A and 7B depict a portion of the operational amplifier of FIG. 5 having a portion of the second amplification path 36, including the above-identified amplifier 40 and its associated intrinsic capacitance C. In FIG. 7A, the intrinsic capacitance C exists between the input and output of the amplifier 40, and the path from the input to output of the second amplifier can have a gain represented by A. FIG. 7B depicts an circuit to equivalent to that shown in FIG. 7A, with the intrinsic capacitance C replaced by an equivalent capacitance CM at the input of the second amplifier 40. The equivalent capacitance CM can have a value equal to that of the intrinsic capacitance C multiplied by a factor equal to (1+A), or CM=(1+A)C.

Figure 5:
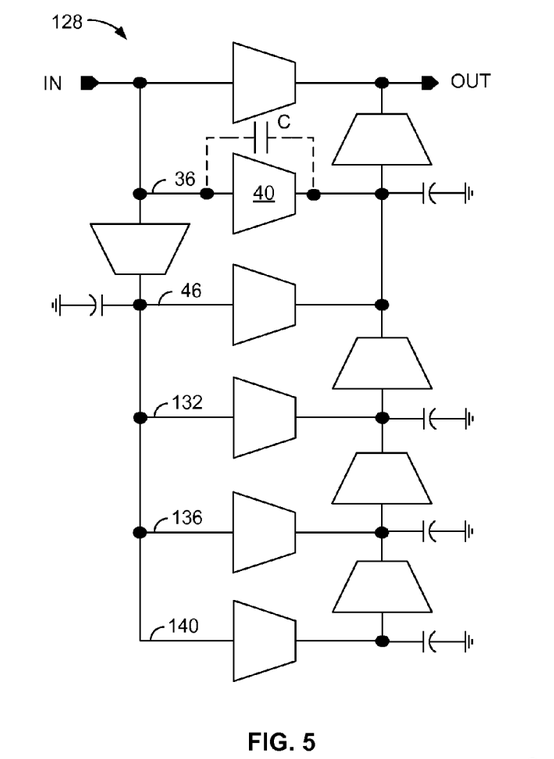
FIG. 5 is a circuit schematic depicting the embodiment of the multipath feedforward operational amplifier depicted in FIG. 3, and showing an intrinsic capacitance of an amplifier of an amplification path of the operational amplifier.
Figure 6:
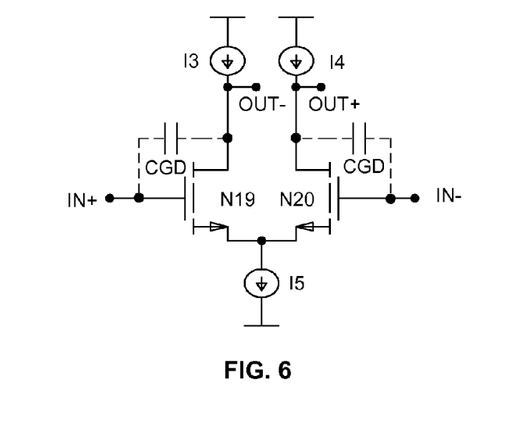
FIG. 6 is a circuit schematic depicting an embodiment of the amplifier having the intrinsic capacitance depicted in FIG. 5.

Thus, the equivalent capacitance CM experienced at the input node of the identified amplifier 40 in the operational amplifier 128 of FIG. 5, and in other embodiments of the operational amplifiers 20, 24 of FIGS. 1 and 2, can have a value as a function of the gain provided not only by this amplifier 40 but also by the portions of the higher-order amplification paths in parallel with the amplifier 40, such as the corresponding portions of the third, fourth, fifth and sixth order amplification paths 46, 132, 136, 140 in FIG. 5. This relatively greater effective capacitance CM at the input node of the amplifier 40 can have an undesirable effect on the overall frequency response of the operational amplifiers 20, 24 if left unmitigated.

The operational amplifiers 20, 24 according to the architectures of FIGS. 1 and 2 can therefore include capacitive cross-coupling between inputs and outputs in selected amplifiers of their amplification paths, which can provide at least some mitigation of the undesirable exacerbation of the Miller effect potentially experienced by these operational amplifiers 20, 24.

Figure 8A:
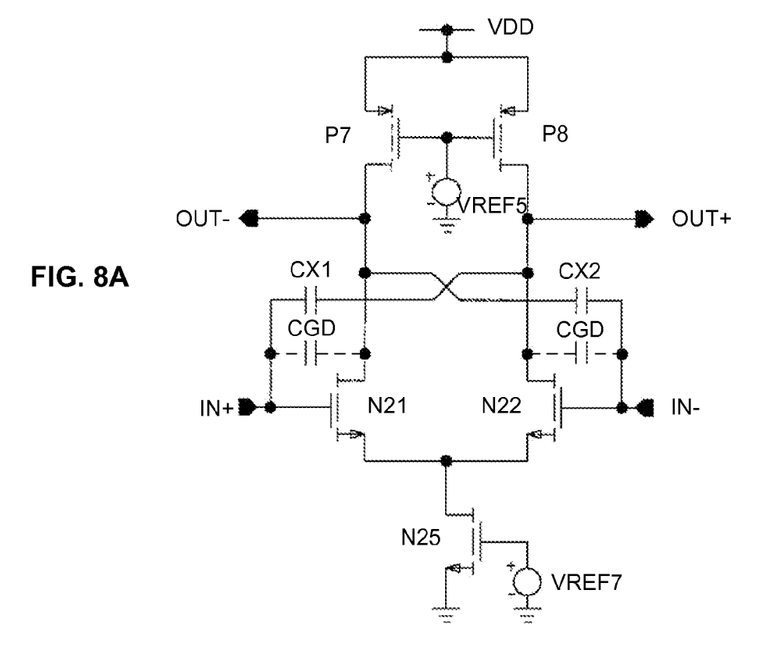
FIGS. 8A-8B are circuit schematics depicting embodiments of amplifiers of the multipath feedforward operation amplifier and having capacitive input-output cross-coupling.
Figure 8B:
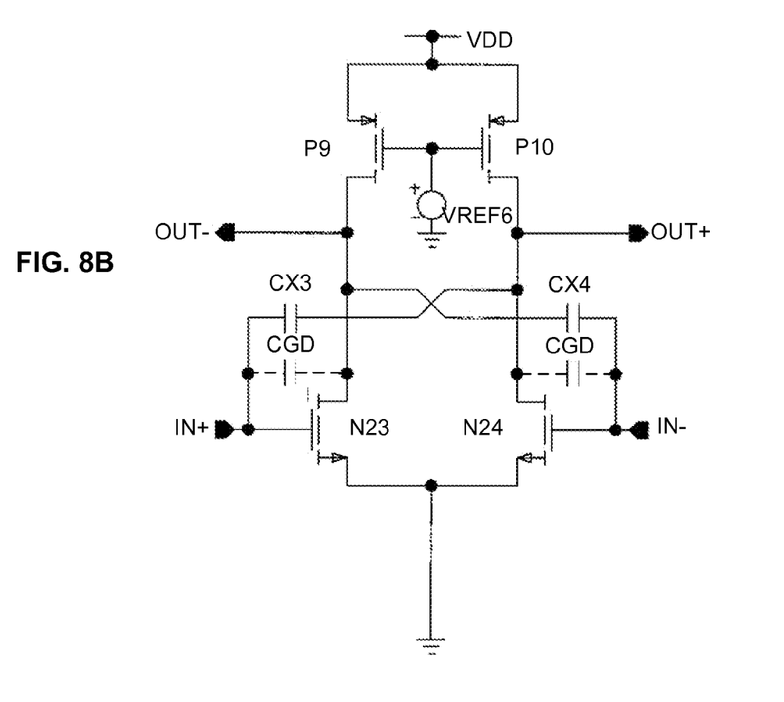

FIGS. 8A and 8B depict exemplary embodiments of amplifiers, having capacitive cross-coupling between their inputs and output, which can be used to implement selected amplifiers of the plurality of amplification paths of the operational amplifiers 20, 24, including amplifiers such as the above-discussed amplifier 40 of the second amplification path 36 in FIGS. 1, 3 and 5, that experience the exacerbated Miller effect. The amplifiers of FIGS. 8A and 8B include amplification transistors N21, N22, N23, N24 similar to those of FIGS. 4A and 4B, respectively, as well as supplemental transistors P7, P8, P9, P10, controlled by reference voltages VREF5, VREF6, to implement current sources connected to the drains and output nodes OUT+, OUT−, similar to as in FIG. 6. The amplifier of FIG. 8A also includes a another supplemental transistor N25, controlled by another voltage source VREF7, to implement a current source at the connected sources of the differential pair of amplification transistors N21, N22, also similar to as in FIG. 6.

The capacitive input-output cross-coupling can include a pair of capacitors CX1, CX2, CX3, CX4 separate and distinct from the intrinsic capacitances CGD of the amplification transistors N21, N22, N23, N24, each cross-coupled from one of the inputs IN+ or IN− (corresponding to one of the differential pair of amplification transistors N21/N23 or N22/N24), to an output OUT+, OUT− oppositely signed from the output to which the intrinsic capacitance CGD is connected (corresponding to the other of the differential pair of amplification transistors N22/N24 or N21/N23). In FIG. 8A, this can include a first cross-coupling capacitor CX1 connected between the positive input IN+(connected to one of the amplification transistors N21) and the positive output OUT+ (connected to the other of the amplification transistors N22), as well as a second cross-coupling capacitor CX2 connected between the negative input IN− (connected to one of the amplification transistors N22) and the negative output OUT− (connected to the other of the amplification transistors N21). In FIG. 8B, this can include cross-coupling capacitors CX3, CX4 having the same type of cross-coupled connections between the inputs and outputs.

This capacitive input-output cross-coupling can mitigate the exacerbated Miller effect described above as follows. The Miller effect acting on the intrinsic capacitance CGD of the first amplification transistor N21/N23 connected to the positive input IN+ can produce an equivalent Miller capacitance at the positive input IN+ having a value represented by $(1+A)$ CGD, where A can represents the gain between the input and output of the identified amplifier 40, and can be a function of both the amplifier 40 as well as the portions of the higher-order paths in parallel with the input and output of the amplifier 40. If the gain A is greater than 1, then this equivalent Miller capacitance can be represented by a positive value. Using a similar circuit analysis, the Miller effect acting on the cross-coupling capacitance CX1 connected between the positive input IN+ and the negative output OUT− can produce an equivalent Miller capacitance at the positive input IN+ having a value represented by $(1-A)$ CX1, where again A represents the gain achieved between the input and output of the second amplifier 40. If the gain A is greater than 1, then this equivalent Miller capacitance can be represented by a negative value, which can be used to negate or offset the positive Miller capacitance resulting from the intrinsic capacitance CGD of the amplification transistor. Similar Miller capacitance values can result at the negative input IN− of the amplifier.

The value of the cross-coupling capacitors connected between the inputs and oppositely-signed output (relative to the connection of the intrinsic capacitance) of the selected amplifiers can be selected to control the relative degree of Miller effect cancellation or mitigation achieved. Ideally, to completely eliminate this Miller effect, the cross-coupling capacitor can be selected to have a capacitance value so that at each input the equivalent Miller capacitance produced by the cross-coupling capacitor has a value equal to but of opposite sign as the equivalent Miller capacitance corresponding to the intrinsic capacitance. In such a scenario, $(1+A)$ CGD=$(A-1)$ CX1, which gives a value of the cross-coupling capacitance of CX1=CGD $(A+1)/(A-1)$ for full cancellation. In practice, it can be difficult to achieve such perfect matching, due to both manufacturing and operational uncertainties in the values of both the intrinsic and cross-coupling capacitances. Therefore, in another embodiment, the cross-coupling capacitances can be selected to each have a value substantially equal to CGD $(A+1)/(A-1)$, where CGD and A are calculated or measured at a predetermined operational power level, temperature, and frequency and selected manufacturing tolerance of the operational amplifiers 20, 24. For example, the predetermined temperature can be 25° C. in one embodiment and 100° C. in another embodiment. The predetermined frequency can be some ratio of the unity gain frequency of the operational amplifier, such as 50% or 10% of the unity gain frequency.

The cross-coupling capacitances can alternatively each be selected to have a value within a range of a predetermined percentage of this ideal value above and below the ideal value (CGD $(A+1)/(A-1)$) calculated or measured at the predetermined operational power level, temperature, frequency and manufacturing tolerance. In one embodiment, the predetermined percentage can be 20%. In another embodiment, the predetermined percentage can be 50%.

Note that the gain A used to select the value of the cross coupling capacitances can be a function of specific implementations of the architectural recipes of FIGS. 1 and 2, as this gain can depend on the overall order of the operational amplifier so constructed, as well as the degree to which AC coupling may be included, as discussed further below.

The capacitive input-output cross-coupling can be included in selected amplifiers of the plurality of amplification paths. Fully differential amplifiers having capacitive input cross-coupling can be implemented similar to as depicted in FIGS. 8A and 8B, with one cross-coupling capacitor connected between a positive input IN+ and a negative output OUT− and a second cross-coupling capacitor connected between the negative input IN− and the positive output OUT+ of the amplification transistor configuration. The first and second cross-coupling capacitors can be of equal selected capacitance values. Different types of single-ended amplifiers may also have capacitive input-output cross-coupling, which can be implemented in various ways. For example, differential-input, single-ended output amplifiers can optionally be implemented using fully differential amplification transistor configurations and a pair of cross-coupling capacitors connected as already described above, and then utilize only a single output. Fully single-ended output amplifiers can also optionally be implemented using fully differential amplification transistor configurations and a pair of cross-coupling capacitors connected as in fully differential amplifiers, and then utilizing only a single input and a single output. Fully single-ended output amplifiers can also optionally be implemented using a single-branch amplification transistor configuration, as described above, and a single cross-coupling capacitor connected between the single input and a fixed voltage, or a voltage moving in an opposite direction as the opposite end of the corresponding intrinsic capacitance.

Figure 9:
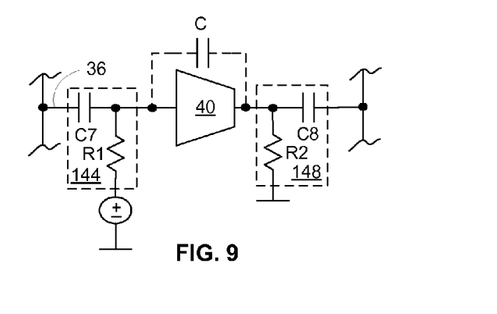
FIG. 9 is a circuit schematic depicting an embodiment of a portion of the amplification path including the amplifier having the intrinsic capacitance depicted in FIG. 5, and having AC coupling in series with the amplifier in the amplification path.

Amplifiers of the plurality of amplification paths, such as those experiencing the exacerbated Miller effects, can also include AC coupling to at least partially mitigate such effects. FIG. 9 depicts a portion of the operational amplifier 128 depicted in FIGS. 7A-7B, including a portion of the second amplification path 36 having the identified amplifier 40 and its associated intrinsic capacitance C, along with the addition of an exemplary embodiment of AC coupling that can be used with this amplifier 40 (and optionally other amplifiers) to reduce the unwanted Miller effects associated with the intrinsic capacitance C. The AC coupling can include a first high-pass filter 144, having an AC coupling capacitor, connecting the portion of the amplification path 36 preceding the amplifier 40 to the input of the amplifier 40, and a second high-pass filter 148, also having an AC coupling capacitor, connecting the output of the amplifier 40 to the portion of the amplification path 36 following the amplifier 40. The first high-pass filter 144 can be a high pass filter as considered from the perspective of a signal travelling from the portion of the amplification path 36 preceding the amplifier 40 to the input of the amplifier 40, and the second high pass filter 148 can be a high pass filter from the perspective of a signal travelling from the output to the input of the amplifier 40, or alternatively from the perspective of a signal travelling from the portion of the amplification path 36 following the amplifier 40 to the output of the amplifier 40. In FIG. 9, both the first and second high pass filters 144, 148 can include a capacitor and a resistor. The first high pass filter 144 can include a capacitor C7 connected between the portion of the amplification path 36 preceding the amplifier 40 to the input of the amplifier 40, and acting as an AC coupling capacitor, and a resistor R1 connected between the input of the amplifier 40 and a voltage reference VREF8. The second high pass filter 148 can include a capacitor C8 connected between the output of the amplifier 40 and the portion of the amplification path 36 following the amplifier 40, and acting as an AC coupling capacitor, and a resistor R2 connected between the input of the amplifier 40 and a voltage reference, e.g., ground.

Amplifiers, of the plurality of amplification paths, that use AC coupling can optionally have AC coupling capacitors connected to only either the inputs or outputs of the amplifiers, or to both. For example, in one embodiment, an amplifier using AC coupling can have one or more AC coupling capacitors connected to only the output (or outputs) of the amplifier, and not to an input (or inputs). In other embodiments, an amplifier using AC coupling can have one or more AC coupling capacitors connected to only the input (or inputs) of the amplifier, and not to an output (or outputs). The selection of either only output AC coupling or only input AC coupling can depend on the desired frequency response of the amplification path including the amplifier having the AC coupling. In other embodiments, and as depicted in FIG. 9, an amplifier using AC coupling can have AC coupling capacitors connected to both the inputs and outputs of the amplifier.

An AC coupling capacitor connected to an input of an amplifier of the plurality of amplification paths can be connected to a gate of an amplification transistor of that amplifier. An AC coupling capacitor connected to an output of an amplifier of the plurality of amplification paths can be connected to a drain of an amplification transistor of that amplifier. In other embodiments, for example in which amplifiers using AC coupling capacitors have other circuits connected to their amplification transistor configurations, an AC coupling capacitor can optionally be connected to an output of an amplifier other than a drain of an amplification transistor connected to an input of that amplifier.

Amplification paths and associated amplifiers of the operational amplifiers 20, 24, such as those experiencing exacerbated Miller effects, can include either or both of capacitive input-output cross-coupling and AC coupling. Typically, these features can achieve the most benefit when used in association with an amplifier of the second-order amplification path 36, 104 that is in parallel with an effectively high-gain circuit including a plurality of portions of a plurality of the higher-order amplification paths, as discussed above. Thus, the operational amplifiers may optionally include these features in only for the amplifier 40, 112 so positioned in the operational amplifiers 20, 24 of FIGS. 1 and 2. However, the operational amplifiers may alternatively include these features in association with other amplifiers of the plurality of amplification paths, instead of or in addition to these specific amplifiers 40, 112 of the second-order amplification paths 36, 104 of FIGS. 1 and 2.

Note that, in embodiments where the amplifier having associated AC coupling is fully or partially differential, the AC coupling can include corresponding AC coupling capacitors in both signal paths of any differential signal paths.

Figure 10A:
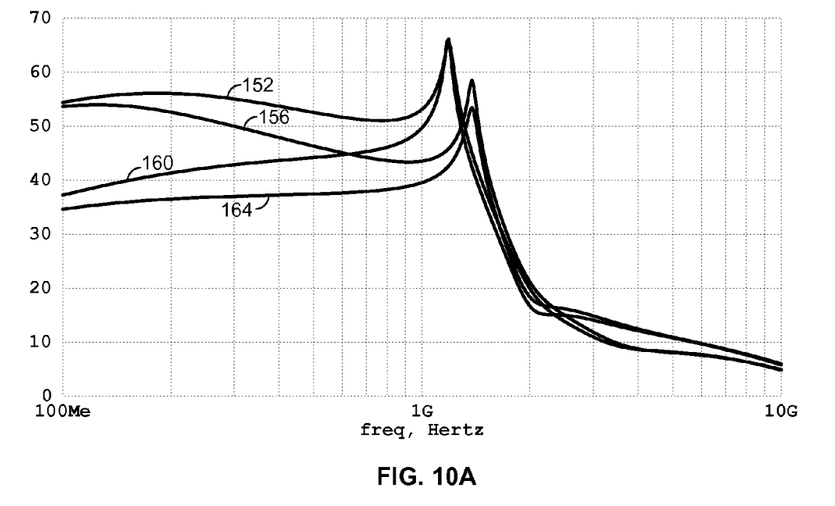
FIGS. 10A-10B are graphs depicting embodiments of the gain frequency response of the multipath feedforward operational amplifier, showing the effects of the presence and absence, and various degrees thereof, of capacitive cross-coupling and AC coupling used in association with an amplifier of an amplification path of the operational amplifier.

FIGS. 10A and 10B depict plots of gain versus frequency resulting from simulations of exemplary embodiments of an operational amplifier 20 similar to that depicted in FIG. 5 and utilizing to various degrees cross-coupling, AC coupling or both. In FIG. 10A, a first plot 152 depicts gain for an embodiment of the operational amplifier 20 including both capacitive cross-coupling and AC coupling. A second plot 156 depicts gain for an embodiment of the operational amplifier 20 including AC coupling but not capacitive cross-coupling. A third plot 160 depicts gain for an embodiment of the operational amplifier 20 including capacitive cross-coupling but not AC coupling. A fourth plot 164 depicts gain for an embodiment of the operational amplifier 20 not including either capacitive cross-coupling or AC coupling. A comparison of the results at 800 MHz shows an improvement of 7.5 dB of gain resulting from capacitive cross-coupling (by comparing the first to the second plots 152, 156), an improvement of 5 dB of gain resulting from AC coupling (by comparing the first to the third plots 152, 160), and an improvement of 12 dB of gain resulting from including both capacitive cross-coupling and AC coupling (by comparing the first to the fourth plots 152, 164).

Figure 10B:
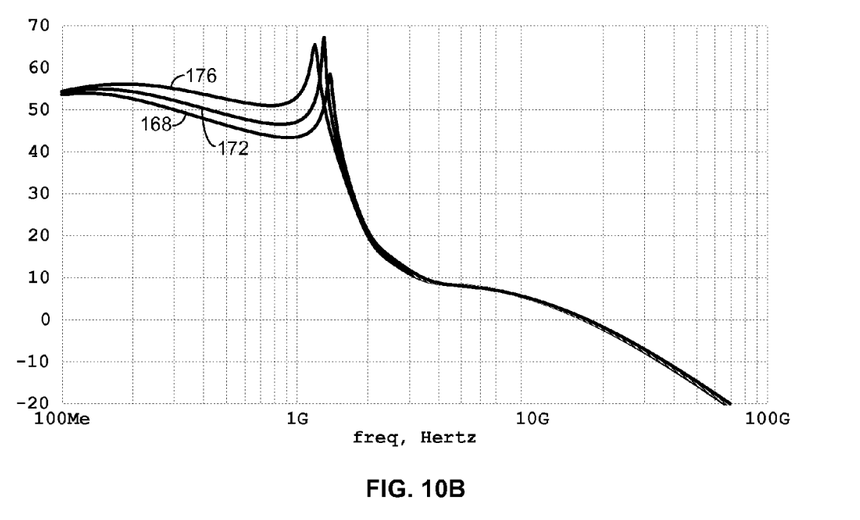

In FIG. 10B, a first plot 168 depicts gain for an embodiment of the operational amplifier 20 including no capacitive cross-coupling. A second plot 172 depicts gain for an embodiment of the operational amplifier 20 including capacitive cross-coupling having cross-coupling capacitors with capacitance values equal to 50% of the value expected to ideally completely negate the Miller effect on the amplifier intrinsic capacitance. A third plot 176 depicts gain for an embodiment of the operational amplifier 20 including capacitive cross-coupling having cross-coupling capacitors with capacitance values equal to 100% of the value expected to ideally completely negate the Miller effect on the amplifier intrinsic capacitance. A comparison of the results at 800 MHz shows an improvement of 3 dB of gain resulting from 50% cross-coupling (by comparing the first to the second plots 168, 172), and an improvement of 7.5 dB of gain resulting from 100% cross-coupling (by comparing the first to the third plots 168, 176).

Figure 11A:
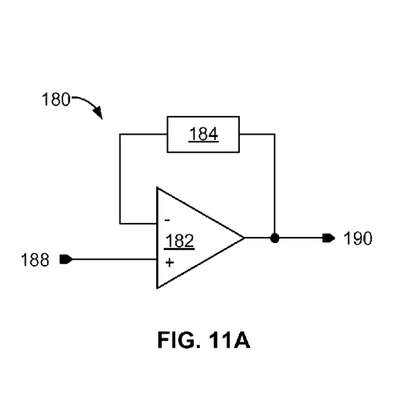
FIGS. 11A-11B are circuit schematics depicting embodiments of feedback circuits including the multipath feedforward operational amplifier.

The multipath feedforward operational amplifiers 20, 24 can be used in feedback circuits. FIG. 11A depicts an embodiment of a feedback circuit 180 including an operational amplifier 182 that can be implemented by an embodiment of the multipath feedforward operational amplifiers 20, 24. The operational amplifier 182 can include differential input terminals and a single-ended output terminal, with a positive input terminal of the operational amplifier 182 connected to an input 188 of the feedback circuit 180 and receiving a corresponding input signal, and the output terminal of the operational amplifier 182 connected to an output 190 of the feedback circuit 180. A negative feedback path can also be connected between the output terminal of the operational amplifier 182 and its negative input terminal, where the feedback path can include one or more circuit elements or sub-circuits 184, such as a resistor, capacitor, inductor, transistor, switch, etc.

Figure 11B:
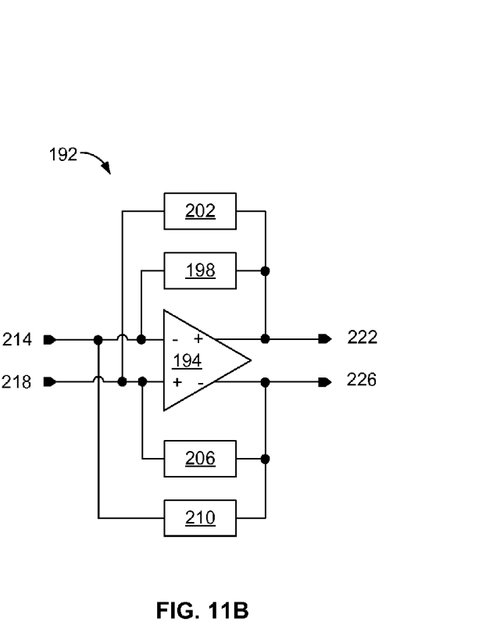

FIG. 11B depicts another embodiment of a feedback circuit 192 including an operational amplifier 194 that can be implemented by an embodiment of the multipath feedforward operational amplifiers 20, 24. The depicted operational amplifier 194 can include differential input and output terminals, with positive and negative input terminals connected to positive and negative inputs 218, 214, respectively, of the feedback circuit 192, and receiving corresponding input signals, and positive and negative output terminals connected to positive and negative outputs 222, 226, respectively, of the feedback circuit 192. The feedback circuit 192 can include both positive and negative feedback paths connected between outputs and inputs of the operational amplifier 194. A first negative feedback path can be connected between the positive output terminal of the operational amplifier 194 and its negative input terminal, and include one or more circuit elements or sub-circuits 198. A second negative feedback path can be connected between the negative output terminal of the operational amplifier 194 and its positive input terminal, and include one or more circuit elements or sub-circuits 206. The one or more circuit elements or sub-circuits 198, 206 can each include one or more of a resistor, capacitor, inductor, transistor, switch, conductor, etc. A first positive feedback path can be connected between the positive output terminal of the operational amplifier 194 and its positive input terminal, and include one or more circuit elements or sub-circuits 202. A second positive feedback path can be connected between the negative output terminal of the operational amplifier 194 and its negative input terminal, and include one or more circuit elements or sub-circuits 210. The one or more circuit elements or sub-circuits 202, 210 can each include one or more of a resistor, capacitor, inductor, transistor, switch, conductor, etc. The feedback circuit 192 can optionally omit the positive feedback paths.

Other embodiments of feedback circuits including an embodiment of the multipath feedforward operational amplifiers 20, 24 are possible. Feedback circuits including an embodiment of the multipath feedforward operational amplifiers 20, 24 can include either negative or positive feedback paths, or combinations thereof. A negative feedback path can optionally be connected between a positive output and a positive input, or between a negative output and a negative input, of an operational amplifier implemented by an embodiment of the operational amplifiers 20, 24, with a negative gain of the feedback path being accomplished by a component in the feedback path.

Additional embodiments of the multipath feedforward operational amplifiers 20, 24 are also possible. For example, any feature of any of the embodiments of the multipath feedforward operational amplifiers 20, 24 described herein can optionally be used in or with any other embodiment of the multipath feedforward operational amplifiers 20, 24. Embodiments of the multipath feedforward operational amplifiers 20, 24 can also optionally include any subset of the components or features of any embodiments of the multipath feedforward operational amplifiers 20, 24 described herein.

What is claimed is:

1. An operational amplifier arranged in a feedback configuration, the operational amplifier comprising:
    a plurality of amplifiers connected to form a plurality of at least partially distinct amplification paths extending from an input terminal to an output terminal of the operational amplifier, each of the amplification paths including a respective subset of the plurality of amplifiers connected in series, at least one of the plurality of amplification paths having at least three of the amplifiers connected in series, and at least two of the amplification paths sharing at least one of the amplifiers;
    wherein the plurality of amplifiers includes a cross-coupled amplifier having an amplification transistor with an intrinsic gate-to-drain capacitance connected between a first input and a first output of the cross-coupled amplifier, and a cross-coupling capacitor connected between the first input and a second output of the cross-coupled amplifier, and
    wherein the plurality of amplifiers includes at least two amplifiers connected in series with each other in a path portion, the path portion connected in parallel with the cross-coupled amplifier.

2. The operational amplifier of claim 1, wherein the first and second outputs of the cross-coupled amplifier are negative and positive differential outputs, respectively.

3. The operational amplifier of claim 1, wherein the cross-coupled amplifier further includes a second cross-coupling capacitor connected between a second input and the first output of the cross-coupled amplifier, wherein the first and second inputs are positive and negative differential inputs, respectively.

4. The operational amplifier of claim 1, wherein the cross-coupling capacitor has a capacitance value selected as a function of the intrinsic gate-to-drain capacitance and a gain experienced between inputs and outputs of the cross-coupled amplifier.

5. The operational amplifier of claim 1, wherein the plurality of amplifiers provides a gain of A between the first input and the first output of the cross-coupled amplifier, and the cross-coupling capacitor has a capacitance value within a range of plus and minus a predetermined percentage above and below a value given by $C_{GD}(A+1)/(A-1)$, where $C_{GD}$ is the intrinsic gate-to-drain capacitance.

6. The operational amplifier of claim 5, wherein the predetermined percentage is 20%.

7. The operational amplifier of claim 5, wherein the predetermined percentage is 50%.

8. The operational amplifier of claim 1, further comprising an AC coupling capacitor connected to and in series with at least one of the outputs of the cross-coupled amplifier in its respective amplification path.

9. The operational amplifier of claim 8, further comprising a second AC coupling capacitor connected to at least one of the inputs of the cross-coupled amplifier.

10. The operational amplifier of claim 1, wherein the plurality of amplification paths include a second order path having two amplifiers connected in series, a third order path having three amplifiers connected in series, and a fourth order path having four amplifiers connected in series, wherein the second order amplification path contains the cross-coupled amplifier.

11. The operational amplifier of claim 1, wherein the amplification transistor is part of an amplification transistor configuration including at least one of: a common-source amplification transistor, a differential pair of amplification transistors, a pseudo differential pair of amplification transistors, and complementary pseudo differential pairs of amplification transistors.

12. The operational amplifier of claim 1, having a loop gain slope of at least one of: steeper than −12 dB/octave over a portion of its frequency response lower than its unity-gain frequency, or steeper than −18 dB/octave over a portion of its frequency response lower than its unity-gain frequency.

13. An operational amplifier arranged in a feedback configuration, the operational amplifier comprising:
 a first and a second amplifier, connected in series in that order, defining a first amplification path that extends between an input terminal and an output terminal of the operational amplifier; and
 a third, a fourth, and the second amplifier, connected in series in that order, defining a second amplification path that extends between the input and output terminals of the operational amplifier,
 wherein the first amplifier includes an amplification transistor with an intrinsic gate-to-drain capacitance connected between a first input and a first output of the first amplifier, and a cross-coupling capacitor connected between the first input and a second output of the first amplifier.

14. The operational amplifier of claim 13, further comprising the third, a fifth, a sixth, and the second amplifier, connected in series in that order, defining a third amplification path that extends between the input and output terminals of the operational amplifier.

15. The operational amplifier of claim 13, wherein a gain of A exists between the gate and drain of the amplification transistor of the first amplifier, and the cross-coupling capacitor has capacitance values within a range of plus and minus a predetermined percentage above and below a value given by CGD (A+1)/(A−1), where CGD is the intrinsic gate-to-drain capacitance, wherein the predetermined percentage is at least one of: 20%, or 50%.

16. The operational amplifier of claim 13, further comprising at least one AC coupling capacitor connected to and in series with at least one of the outputs of the first amplifier in the first amplification path.

17. The operational amplifier of claim 13, having a loop gain slope of at least one of: steeper than −12 dB/octave over a portion of its frequency response lower than its unity-gain frequency, or steeper than −18 dB/octave over a portion of its frequency response lower than its unity-gain frequency.

18. An operational amplifier arranged in a feedback configuration, the operational amplifier comprising:
 a first and a second amplifier, connected in series in that order, defining a first amplification path that extends between an input terminal and an output terminal of the operational amplifier; and
 the first, a third, and a fourth amplifier, connected in series in that order, defining a second amplification path that extends between the input and output terminals of the operational amplifier,
 wherein the second amplifier includes an amplification transistor with an intrinsic gate-to-drain capacitance connected between a first input and a first output of the first amplifier, and a cross-coupling capacitor connected between the first input and a second output of the first amplifier.

19. The operational amplifier of claim 18, further comprising the first, a fifth, a sixth, and the fourth amplifier, connected in series in that order, defining a third amplification path that extends between the input and output terminals of the operational amplifier.

20. The operational amplifier of claim 18, wherein a gain of A exists between the gate and drain of the amplification transistor of the second amplifier, and the cross-coupling capacitor has capacitance values within a range of plus and minus a predetermined percentage above and below a value given by CGD (A+1)/(A−1), where CGD is the intrinsic gate-to-drain capacitance, wherein the predetermined percentage is at least one of: 20%, or 50%.

21. The operational amplifier of claim 18, further comprising at least one AC coupling capacitors connected to and in series with an at least one of the outputs of the second amplifier in the first amplification path.

22. The operational amplifier of claim 18, having a loop gain slope of at least one of: steeper than −12 dB/octave over a portion of its frequency response lower than its unity-gain frequency, or steeper than −18 dB/octave over a portion of its frequency response lower than its unity-gain frequency.

23. An operational amplifier arranged in a feedback configuration, the operational amplifier comprising:
 a first amplifier, an AC coupling capacitor, and a second amplifier, connected in series in that order, defining a first amplification path that extends between an input terminal and an output terminal of the operational amplifier, wherein the first amplifier is connected directly to the input terminal, the second amplifier is connected directly to the output terminal and the AC coupling capacitor is connected to and in series with at least one output of the first amplifier; and
 a third, a fourth, and the second amplifier, connected in series in that order, defining a second amplification path that extends between the input and output terminals of the operational amplifier.

24. The operational amplifier of claim 23, wherein an amplification transistor of the first amplifier has an intrinsic gate-to-drain capacitance connected between a first input and a first output of the first amplifier, and the first amplifier includes a cross-coupling capacitor connected between the first input and a second output of the first amplifier.

25. The operational amplifier of claim 23, further comprising the third, a fifth, a sixth, and the second amplifier, connected in series in that order, defining a third amplification path that extends between the input and output terminals of the operational amplifier.

26. The operational amplifier of claim 24, wherein a gain of A exists between the gate and drain of the amplification transistor of the first amplifier, and the cross-coupling capacitor has capacitance values within a range of plus and minus a predetermined percentage above and below a value given by CGD (A+1)/(A−1), where CGD is the intrinsic gate-to-drain capacitance, wherein the predetermined percentage is at least one of: 20%, or 50%.

27. The operational amplifier of claim 23, having a loop gain slope of at least one of: steeper than −12 dB/octave over a portion of its frequency response lower than its unity-gain frequency, or steeper than −18 dB/octave over a portion of its frequency response lower than its unity-gain frequency.

28. An operational amplifier arranged in a feedback configuration, the operational amplifier comprising:

a first amplifier, a second amplifier, and an AC coupling capacitor, connected in series in that order, defining a first amplification path that extends between an input terminal and an output terminal of the operational amplifier, wherein the AC coupling capacitor is connected to and in series with at least one output of the second amplifier; and the first, a third, and a fourth amplifier, connected in series in that order, defining a second amplification path that extends between the input and output terminals of the operational amplifier.

29. The operational amplifier of claim 28, wherein an amplification transistor of the second amplifier has an intrinsic gate-to-drain capacitance connected between a first input and a first output of the second amplifier, and the second amplifier includes a cross-coupling capacitor connected between the first input and a second output of the second amplifier.

30. The operational amplifier of claim 28, further comprising the first, a fifth, a sixth, and the fourth amplifier, connected in series in that order, defining a third amplification path that extends between the input and output terminals of the operational amplifier.

31. The operational amplifier of claim 29, wherein a gain of A exists between the gate and drain of the amplification transistor of the second amplifier, and the cross-coupling capacitor has capacitance values within a range of plus and minus a predetermined percentage above and below a value given by CGD $(A+1)/(A-1)$, where CGD is the intrinsic gate-to-drain capacitance, wherein the predetermined percentage is at least one of: 20%, or 50%.

32. The operational amplifier of claim 28, having a loop gain slope of at least one of: steeper than −12 dB/octave over a portion of its frequency response lower than its unity-gain frequency, or steeper than −18 dB/octave over a portion of its frequency response lower than its unity-gain frequency.

* * * * *